(12) United States Patent
Kim

(10) Patent No.: US 10,903,810 B2
(45) Date of Patent: Jan. 26, 2021

(54) APPARATUS FOR DETECTING NEURAL SPIKE

(71) Applicant: Samsung Electronics Co., Ltd., Suwon-si (KR)

(72) Inventor: JongPal Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 16/367,639

(22) Filed: Mar. 28, 2019

(65) Prior Publication Data
US 2020/0014352 A1      Jan. 9, 2020

(30) Foreign Application Priority Data
Jul. 4, 2018   (KR) ........................ 10-2018-0077775

(51) Int. Cl.
| | |
|---|---|
| H03F 3/45 | (2006.01) |
| H03G 3/30 | (2006.01) |
| H03M 1/12 | (2006.01) |
| H03M 1/66 | (2006.01) |
| H03K 19/0175 | (2006.01) |

(52) U.S. Cl.
CPC ....... *H03G 3/3036* (2013.01); *H03F 3/45179* (2013.01); *H03G 3/3089* (2013.01); *H03K 19/017509* (2013.01); *H03M 1/12* (2013.01); *H03M 1/66* (2013.01); *H03F 2200/513* (2013.01); *H03F 2203/45* (2013.01)

(58) Field of Classification Search
CPC ........................................................ H03F 3/45
USPC ................................................. 330/254, 261
See application file for complete search history.

(56) References Cited

U.S. PATENT DOCUMENTS

| | | | | |
|---|---|---|---|---|
| 4,416,283 | A * | 11/1983 | Slocum ................ | A61B 5/0031 128/903 |
| 6,700,443 | B2 | 3/2004 | Desbonnets et al. | |
| 6,760,552 | B1 | 7/2004 | Tajima et al. | |
| 7,158,911 | B2 * | 1/2007 | Gunther ................ | G01K 7/015 702/132 |
| 9,237,045 | B2 | 1/2016 | Kizer et al. | |
| 9,543,975 | B1 | 1/2017 | Melanson et al. | |
| 9,674,009 | B2 * | 6/2017 | Dong ....................... | H04B 1/16 |
| 10,355,655 | B2 * | 7/2019 | Nallani ................ | H03F 1/3211 |

FOREIGN PATENT DOCUMENTS

| | | |
|---|---|---|
| CN | 1376329 A | 10/2002 |
| CN | 101542899 A | 9/2009 |
| JP | 8-205271 A | 8/1996 |
| JP | 4899843 B2 | 3/2012 |

(Continued)

*Primary Examiner* — Henry Choe
(74) *Attorney, Agent, or Firm* — NSIP Law

(57) ABSTRACT

An apparatus for detecting a neural spike includes: a preprocessing circuit configured to remove a low-frequency component from a neural signal to form a low-frequency component removed neural signal, and amplify the low-frequency component removed neural signal; a comparing circuit configured to compare an output signal of the preprocessing circuit to a threshold signal; a merging circuit configured to merge spikes within a reference interval of an output signal of the comparing circuit into one peak, and to generate, based on the merging of the spikes, an output signal comprising pulses; and a counting circuit configured to count the pulses.

22 Claims, 13 Drawing Sheets

(56) References Cited

FOREIGN PATENT DOCUMENTS

| | | |
|---|---|---|
| JP | 2016-537038 A | 12/2016 |
| JP | 6098508 B2 | 3/2017 |
| KR | 10-0599528 B1 | 7/2006 |
| KR | 10-0790967 B1 | 1/2008 |
| KR | 10-0804637 B1 | 2/2008 |

* cited by examiner

1100

APPARATUS FOR DETECTING NEURAL SPIKE

CROSS-REFERENCE TO RELATED APPLICATIONS

This application claims the benefit under 35 USC § 119(a) of Korean Patent Application No. 10-2018-0077775 filed on Jul. 4, 2018 in the Korean Intellectual Property Office, the entire disclosure of which is incorporated herein by reference for all purposes.

BACKGROUND

1. Field

The following description relates to an apparatus for detecting a neural spike.

2. Description of Related Art

Neural signal detection and analysis is important in neuroscientific research. A neural signal is associated with an electrically excitable cell that processes and transmits information through electrical and chemical signals. In an electrical aspect, a voltage-gated ion channel is opened in response to neurons being sufficiently stimulated, and neural signals are transmitted through an axon terminal. In a chemical aspect, a voltage-gated calcium channel is opened at the axon terminal in response to an action potential, and chemicals such as neurotransmitters are released toward synapses. Information contained in the neural signals is identified through a frequency of spikes, rather than a signal level.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for detecting a neural spike includes: a preprocessing circuit configured to remove a low-frequency component from a neural signal to form a low-frequency component removed neural signal, and amplify the low-frequency component removed neural signal; a comparing circuit configured to compare an output signal of the preprocessing circuit to a threshold signal; a merging circuit configured to merge spikes within a reference interval of an output signal of the comparing circuit into one peak, and to generate, based on the merging of the spikes, an output signal comprising pulses; and a counting circuit configured to count the pulses.

The preprocessing circuit may include a high-pass filter (HPF) configured to remove the low-frequency component from the neural signal, and a first amplifier configured to linearly amplify an output signal of the HPF.

The apparatus may further include: a first gain controller configured to control a gain of the first amplifier by adjusting a direct current (DC) level of an input signal of the first amplifier.

The first gain controller may include a voltage digital-to-analog converter (VDAC) configured to adjust an output voltage of the HPF.

The preprocessing circuit may further include a common bias generator configured to compensate for a metal oxide semiconductor (MOS) threshold voltage of the first amplifier that varies.

The common bias generator may include an average generator configured to generate an average of differential output signals of the first amplifier, an offset generator configured to generate an offset value corresponding to the average generator, a compensation value generator configured to generate a compensation value to compensate for the MOS threshold voltage of the first amplifier, and a calculator configured to generate a feedback signal by performing a calculation on an output signal of the average generator, the offset value, and the compensation value, wherein the feedback signal is supplied to the first amplifier to compensate for the MOS threshold voltage of the first amplifier.

The preprocessing circuit may include a differentiator configured to differentiate an output signal of the first amplifier, and a second amplifier configured to linearly amplify an output signal of the differentiator.

The apparatus may further include: a second gain controller configured to control a gain of the second amplifier by adjusting a DC level of an input signal of the second amplifier.

The second gain controller may include a VDAC configured to adjust an output voltage of the differentiator.

The comparing circuit may include a threshold signal generator configured to generate, as the threshold signal, either one or both of a dynamic signal based on the output signal of the preprocessing circuit and a static signal having a predetermined level.

The merging circuit may include: a first flip-flop configured to receive the output signal of the comparing circuit through a clock port and receive a logical high signal through an input port; a flip-flop circuit including at least one second flip-flop, the flip-flop circuit being configured to receive an output signal of the first flip-flop through a reset port of each of the at least one second flip-flop, generate a rising edge in the output signal comprising the pulses based on a clock signal after being released from a reset state in response to a first rising edge of the output signal of the comparing circuit, and generate a falling edge in the output signal comprising the pulses after the reference interval elapses, based on the clock signal; and a reset circuit configured to reset the first flip-flop after the reference interval elapses.

The flip-flop circuit may be further configured to generate the falling edge in the output signal comprising the pulses after the reference interval elapses based on the clock signal. The reset circuit may be further configured to reset the first flip-flop in response to the falling edge.

In another general aspect, an amplification apparatus includes: an amplifier configured to amplify an input signal of the amplifier; and a gain controller configured to control a gain of the amplifier by adjusting a direct current (DC) level of the input signal of the amplifier.

The amplification apparatus may further include: a differentiator configured to remove a low-frequency component from an input signal of the differentiator, wherein the input signal of the amplifier corresponds to an output signal of the differentiator.

The gain controller may include a voltage digital-to-analog converter (VDAC) configured to adjust an output voltage of the differentiator.

In another general aspect, an amplification apparatus includes: an amplifier configured to amplify an input signal of the amplifier; and a common bias generator configured to compensate for a metal oxide semiconductor (MOS) threshold voltage of the amplifier that varies.

The common bias generator may include an average generator configured to generate an average of differential output signals of the amplifier, an offset generator configured to generate an offset value corresponding to the average generator, a compensation value generator configured to generate a compensation value to compensate for the MOS threshold voltage of the amplifier; and a calculator configured to generate a feedback signal by performing a calculation on an output signal of the average generator, the offset value, and the compensation value. The feedback signal may be supplied to the amplifier to compensate for the MOS threshold voltage of the amplifier.

The performing of the calculation on the output signal of the average generator, the offset value, and the compensation value may include subtracting the offset value from the output signal of the average generator and adding the compensation value to a result of the subtracting of the offset value from the output signal of the average generator.

The common bias generator may be further configured to compensate for the MOS threshold voltage of the amplifier by providing a feedback signal to the amplifier.

In another general aspect, an apparatus for detecting a neural spike includes: a merging circuit configured to merge spikes within a reference interval of an input signal corresponding to a neural signal into one peak, and to generate, based on the merging of the spikes, an output signal comprising pulses; and a counting circuit configured to count the pulses.

The merging circuit may include a first flip-flop configured to receive an input signal corresponding to the neural signal through a clock port and receive a logical high signal through an input port, a flip-flop circuit including at least one second flip-flop, the flip-flop circuit being configured to receive an output signal of the first flip-flop through a reset port of each of the at least one second flip-flop, generate a rising edge in the output signal comprising the pulses based on a clock signal after being released from a reset state in response to a first rising edge of the input signal corresponding to the neural signal, and generate a falling edge in the output signal comprising the pulses after the reference interval elapses based on the clock signal, and a reset circuit configured to reset the first flip-flop after the reference interval elapses.

The flip-flop circuit may be further configured to generate the falling edge in the output signal comprising the pulses after the reference interval elapses, based on the clock signal. The reset circuit may be further configured to reset the first flip-flop in response to the falling edge.

The counting of the pulses may indicate a frequency of the spikes.

The counting of the pulses may be based on a period of a period of a reference signal generated by the counting circuit.

Other features and aspects will be apparent from the following detailed description, the drawings, and the claims.

Figure 1:
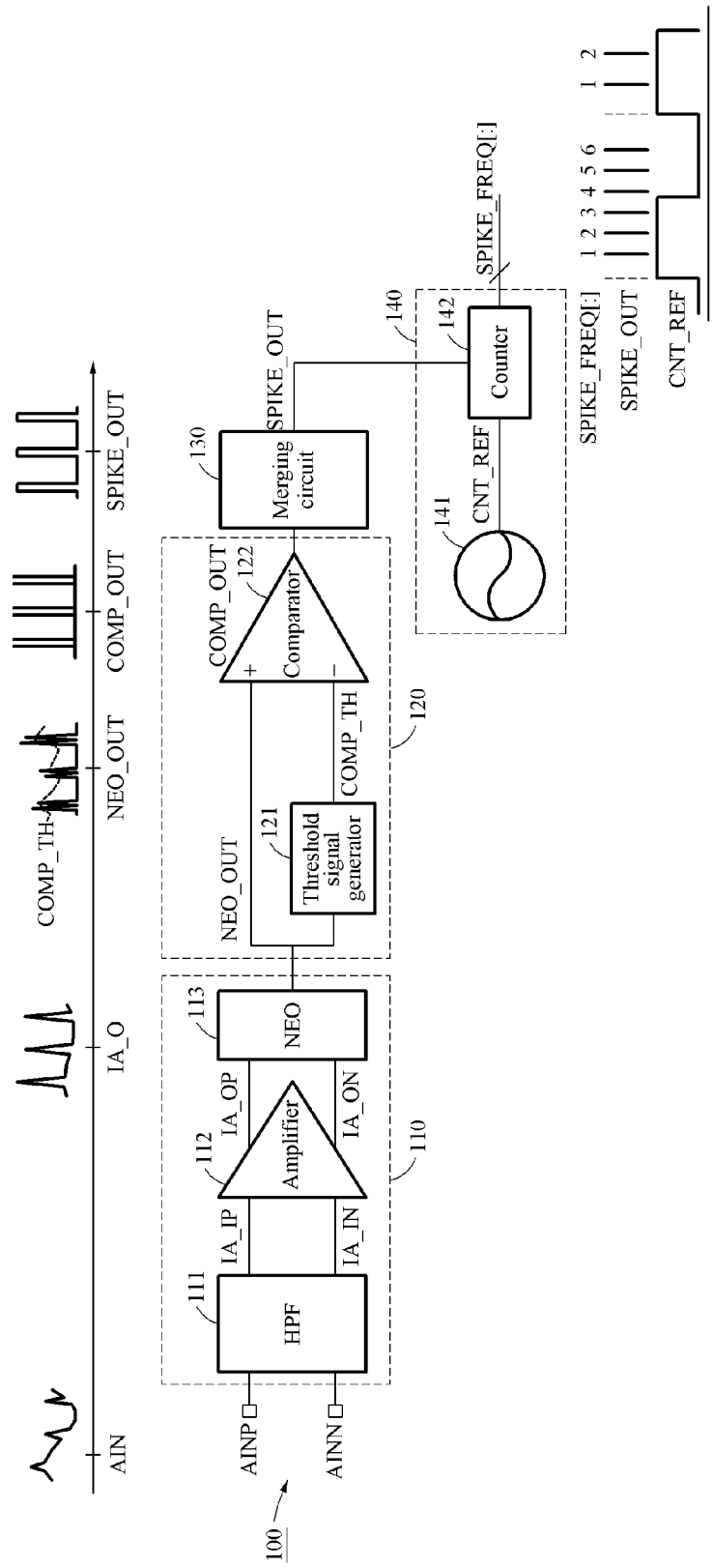
FIG. 1 illustrates an example of a neural spike detecting apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

It is noted that use of the term "may" with respect to an example or embodiment, e.g., as to what an example or embodiment may include or implement, means that at least one example or embodiment exists where such a feature is included or implemented while all examples and embodiments are not limited thereto.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates an example of a neural spike detecting apparatus 100.

Referring to FIG. 1, the neural spike detecting apparatus 100 includes a preprocessing circuit 110, a comparing circuit 120, a merging circuit 130, and a counting circuit 140. The neural spike detecting apparatus 100 detects a frequency of spikes in a neural signal. The neural signal delivers information through a frequency of spikes rather than a signal level, and thus the frequency of spikes is an important factor to verify the information included in the neural signal.

The preprocessing circuit 110 removes a low-frequency component from a neural signal to form a low-frequency component removed neural signal, and amplifies the low-frequency component removed neural signal, thereby processing the neural signal to be suitable for spike detection. The preprocessing circuit 110 may include a high-pass filter (HPF) 111, an amplifier 112, and a nonlinear energy operator (NEO) 113.

The HPF 111 removes low-frequency components from input signals AINP and AINN to form low-frequency component removed input signals IA_IP and IA_IN. The amplifier 112 amplifies the low-frequency component removed input signals IA_IP and IA_IN, and outputs output signals IA_OP and IA_ON corresponding to the input signals IA_IP and IA_IN, respectively. The input signals AINP and AINN correspond to neural signals. When indicating a signal X, a signal X_P and a signal X_N denote a positive component and a negative component of a differential signal, respectively. The amplifier 112 is, for example, an instrumentation amplifier, which linearly amplifies the input signals IA_IP and IA_IN.

The NEO 113 may include a differentiator and a nonlinear amplifier. The configuration of the NEO 113 will be described further below. The differentiator differentiates the output signals IA_OP and IA_ON to remove low-frequency components from the output signals IA_OP and IA_ON, and the nonlinear amplifier amplifies the low-frequency component removed output signals IA_OP and IA_ON. The nonlinear amplifier nonlinearly amplifies the low-frequency component removed output signals IA_OP and IA_ON and, thus further amplifies the signals amplified by the amplifier 112. In an example, a gain of either one or both of the amplifier 112 and the nonlinear amplifier of the NEO 113 is controlled based on a direct current (DC) level. A neural signal contains information in a pulse frequency rather than the DC level and thus, is amplified by controlling the DC level. A gain control will be described further below.

The comparing circuit 120 compares an output signal NEO_OUT to a threshold signal COMP_TH. The comparing circuit 120 includes a threshold signal generator 121 and a comparator 122. The threshold signal generator 121 generates either one or both of a dynamic signal based on the output signal NEO_OUT and a static signal having a predetermined level as the threshold signal COMP_TH. For example, the threshold signal generator 121 generates the dynamic signal through low-pass filtering of the output signal NEO_OUT or generates the dynamic signal by detecting a peak in the output signal NEO_OUT. The comparator 122 compares the output signal NEO_OUT to the threshold signal COMP_TH and outputs an output signal COMP_OUT.

The merging circuit 130 merges spikes within a reference interval of the output signal COMP_OUT into one peak and outputs an output signal SPIKE_OUT. A first reference interval is determined based on a clock signal provided to the merging circuit 130. Due to the differentiating process of the differentiator or another factor, a single peak in the input signal AINP, AINN may appear as a plurality of peaks in the output signal COMP_OUT. The merging circuit 130 merges such peaks into one peak, thereby preventing an error from occurring in a process of counting peaks.

Referring to waveforms shown in FIG. 1, a waveform of an input signal AIN includes a low-frequency component represented as a wave and a high-frequency component represented as a peak. In response to the HPF 111 removing a low-frequency component from the input signal AIN and the amplifier 112 amplifying the low-frequency component removed input signal AIN, an output signal IA_O is generated. In the output signal IA_O, the low-frequency component is restrained, and the peak is amplified.

If the output signal IA_O passes through the differentiator and the nonlinear amplifier, the output signal IA_O becomes the output signal NEO_OUT. In the output signal NEO_OUT, the low-frequency component is removed, and the peak is further amplified. However, due to a process of differentiating peaks in the output signal IA_O or another factor, a single peak in the output signal IA_O may appear as a plurality of peaks in the output signal NEO_OUT.

The comparator 122 compares the output signal NEO_OUT to the threshold signal COMP_TH and generates the output signal COMP_OUT. The output signal COMP_OUT is a digital signal, and components of the output signal NEO_OUT greater than those of the threshold signal COMP_TH are represented as logical high in the output signal COMP_OUT. Adjacent pulses in the output signal COMP_OUT correspond to a single peak in the input signal AIN in practice. Thus, the merging circuit 130 merges the adjacent pulses into one pulse and outputs the output signal SPIKE_OUT.

The counting circuit 140 counts pulses in the output signal SPIKE_OUT. The counting circuit 140 counts the pulses using a counter 142 based on a reference period. The reference period corresponds to a period of a reference signal CNT_REF output from an oscillator 141. Referring to a timing diagram shown in FIG. 1, the pulses in the output signal SPIKE_OUT are counted based on the period of the reference signal CNT_REF, and an output signal SPIKE_FREQ[:] is output. Based on count information included in the output signal SPIKE_FREQ[:], a frequency of spikes in the input signals AINP and AINN is detected.

Figure 2:
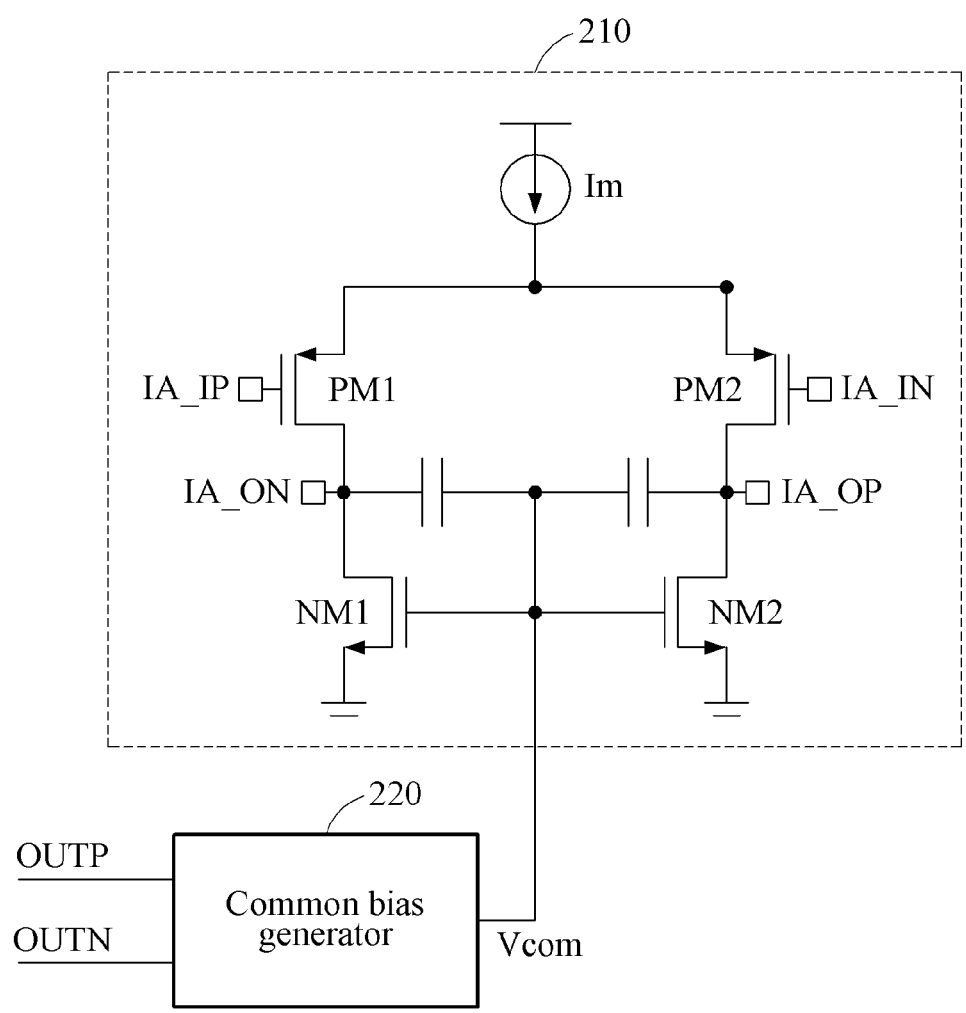
FIG. 2 illustrates an example of an amplifier and a common bias generator.

FIG. 2 illustrates an example of an amplifier 210 and a common bias generator 220.

Referring to FIG. 2, the amplifier 210 includes P-channel metal oxide semiconductors (PMOSs) PM1 and PM2 and N-channel metal oxide semiconductors (NMOSs) NM1 and NM2. The amplifier 210 is an instrumentation amplifier, which amplifies input signals IA_IP and IA_IN and generates output signals IA_ON and IA_OP.

For a low power consumption, the amplifier 210 operates at a low system voltage. In an example in which a normal system voltage is 1.8 volts (V), the amplifier 210 operates at a system voltage of 0.6 V. The NMOSs NM1 and NM2 serve to maintain DC levels of the output signals IA_ON and IA_OP to be a predetermined level. For example, the NMOSs NM1 and NM2 maintain the DC levels of the output signals IA_ON and IA_OP to be about 0.3 V. According to a process condition, a predetermined change occurs in a metal oxide semiconductor (MOS) threshold voltage. For example, the MOS threshold voltage is decreased by about 0.1 V in a fast condition and is increased by about 0.1 V in a slow condition, as compared to a typical condition. In response to such changes in the process condition, the NMOSs NM1 and NM2 may not perform suitably. Thus, the amplifier 210 fails in the amplification.

A common bias generator 220 compensates for the MOS threshold voltage which varies according to the process condition, and thus the NMOSs NM1 and NM2 maintain the DC levels of the output signals IA_ON and IA_OP to be the predetermined level. Thus, the amplifier 210 amplifies the input signals IA_IP and IA_IN under the provided processing condition. For example, the output signals IA_ON and IA_OP are supplied to the common bias generator 220 as input signals OUTN and OUTP, and the common bias generator 220 generates a feedback signal Vcom based on the output signals OUTN and OUTP. The feedback signal Vcom is supplied to the amplifier 210, and an effect of the MOS threshold voltage of the amplifier 210 is compensated for based on the feedback signal Vcom. As the effect of the MOS threshold voltage is compensated for continuously and automatically, the amplifier 210 operates robustly against a corner condition such as the fast condition or the slow condition.

Figure 3:
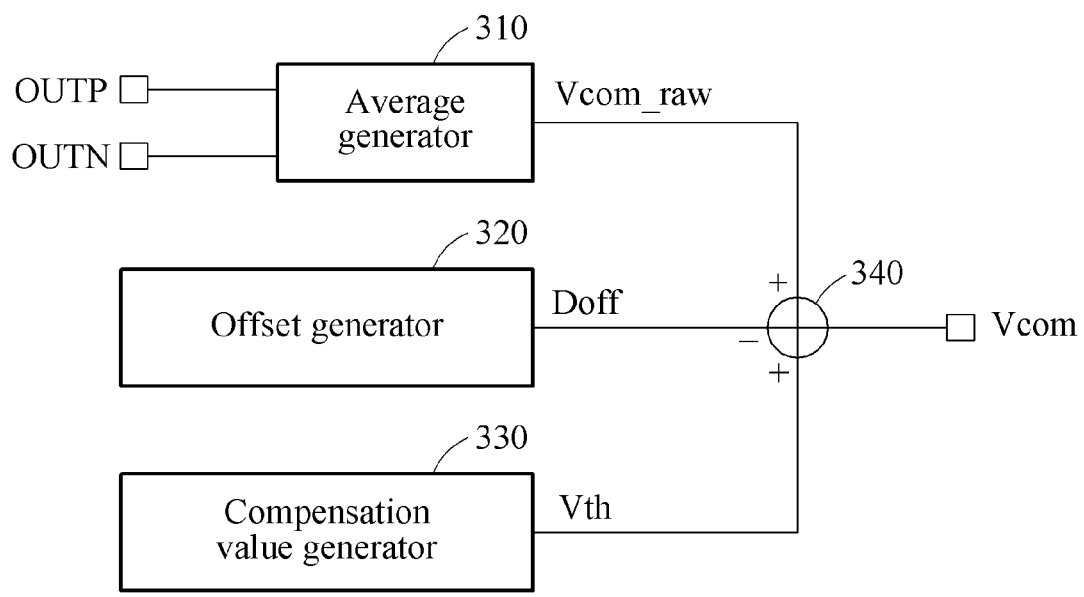
FIG. 3 illustrates an example of a common bias generator.

FIG. 3 illustrates an example of a common bias generator 300.

Referring to FIG. 3, the common bias generator 300 includes an average generator 310, an offset generator 320, a compensation value generator 330, and a calculator 340.

The average generator 310 receives input signals OUTP and OUTN, generates an average of the input signals OUTP and OUTN, and outputs an output signal Vcom_raw. Since there exists an offset of the average generator 310, the output signal Vcom_raw includes the offset of the average generator 310 in addition to the input signals OUTP and OUTN. The output signal Vcom_raw is expressed by Equation 1.

$$Vcom\_raw=(OUTP+OUTN)/2+Doff \qquad [\text{Equation 1}]$$

In Equation 1, Doff is the offset of the average generator 310.

The offset generator 320 generates the offset Doff corresponding to the average generator 310. The offset generator 320 includes circuit elements corresponding to at least a portion of circuit elements in the average generator 310 and generates the offset Doff corresponding to the average generator 310 through the circuit elements corresponding to at least the portion of the circuit elements in the average generator 310.

The compensation value generator 330 generates a compensation value Vth to compensate for an MOS threshold voltage of an amplifier according to a process condition. Here, the amplifier corresponds to the amplifier 210 of FIG. 2.

The calculator 340 generates a feedback signal Vcom by performing a calculation on the output signal Vcom_raw, the offset Doff, and the compensation value Vth. For example, the calculator 340 subtracts the offset Doff from the output signal Vcom_raw and adds the compensation value Vth to a result of the subtracting of the offset Doff from the output signal Vcom_raw. The feedback signal Vcom is expressed by Equation 2.

$$Vcom=(OUTP+OUTN)/2+Vth \qquad [\text{Equation 2}]$$

The feedback signal Vcom is supplied to the amplifier, and the MOS threshold voltage of the amplifier is compensated for based on the feedback signal Vcom. In this example, the amplifier corresponds to the amplifier 210 of FIG. 2.

Figure 4:
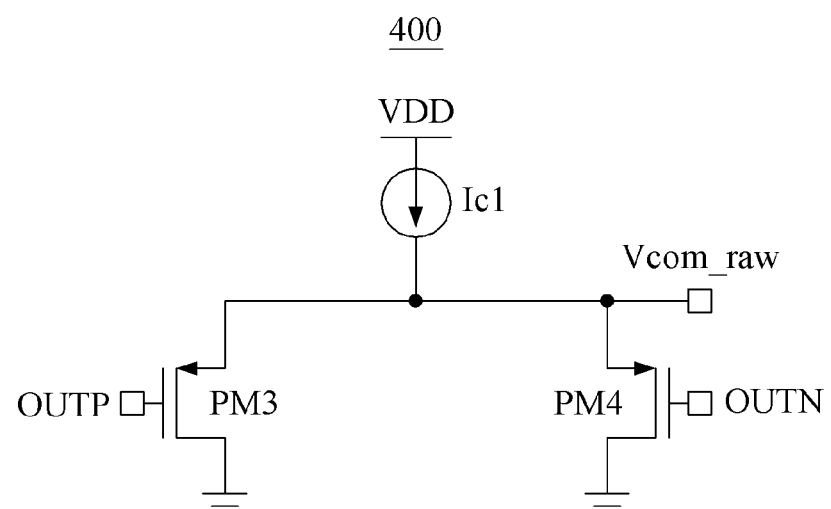
FIG. 4 illustrates an example of an average generator.

FIG. 4 illustrates an example of an average generator 400. Referring to FIG. 4, the average generator 400 includes PMOSs PM3 and PM4. The average generator 400 receives input signals OUTP and OUTN and outputs an average of the input signals OUTP and OUTN as an output signal Vcom_raw. The PMOSs PM3 and PM4 have the same dimension. For example, the dimension of the PMOS PM3 is PW3/PL3, and the dimension of the PMOS PM4 is PW4/PL4. In this example, PW3/PL3=PW4/PL4 is satisfied. In this example, W is a width of an MOS, and L is a length of the MOS. Thus, PW3 and PL3 are a width and a length, respectively, of the PMOS PM3, and PW4 and PL4 are a width and a length, respectively, of the PMOS PM4.

Figure 5:
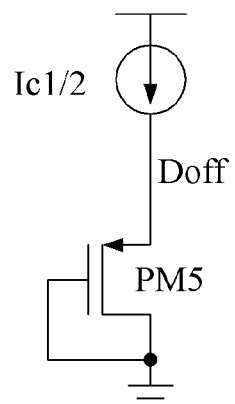
FIG. 5 illustrates an example of an offset generator.

FIG. 5 illustrates an example of an offset generator 500. Referring to FIG. 5, the offset generator 500 includes a PMOS PM5. An offset Doff corresponds to a source voltage of the PMOS PM5. For example, a dimension of the PMOS PM5 is PW5/PL5, and PW5/PL5=PW3/PL3/2=PW4/PL4/2 is satisfied. In this example, PW5 and PL5 are a width and a length, respectively, of the PMOS PM5. Further, an operating current Ic1/2 of the offset generator 500 is a half of an operating current Ic1 of the average generator 400 of FIG. 4.

Figure 6:
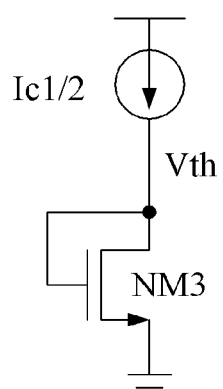
FIG. 6 illustrates an example of a compensation value generator.

FIG. 6 illustrates an example of a compensation value generator 600.

Referring to FIG. 6, the compensation value generator 600 includes an NMOS NM3 and generates a compensation value Vth using the NMOS NM3. The compensation value Vth corresponds to a drain voltage or a gate voltage of the NMOS NM3. A dimension of the NMOS NM3 is NW3/NL3, and the compensation value generator 600 operates with an operating current Ic1/2. In this example, NW3 and NL3 are a width and a length, respectively, of the NMOS NM3.

Figure 7:
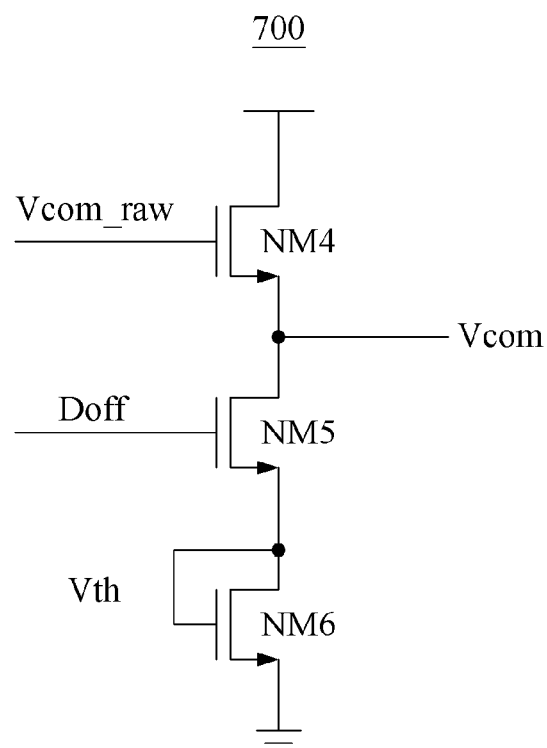
FIG. 7 illustrates an example of a calculator.

FIG. 7 illustrates an example of a calculator 700. Referring to FIG. 7, the calculator 700 includes NMOSs NM4, NM5, and NM6. An output signal Vcom_raw, an offset Doff, and a compensation value Vth are provided to gates of the NMOSs NM4, NM5, and NM6, and a feedback voltage Vcom is generated as a source voltage of the NMOS NM4 and a drain voltage of the NMOS NM5. In an example in which a dimension of the NMOS NM4 is NW4/NL4, a dimension of the NMOS NM5 is NW5/NL5 and a dimension of the NMOS NM6 is NW6/NL6, NW5/NL5=NW4/NL4 and NW6/NL6=NW3/NL3 are satisfied. In this example, NW4 and NL4 are a width and a length, respectively, of the NMOS NM4, NW5 and NL5 are a width and a length, respectively, of the NMOS NM5, and NW6 and NL6 are a width and a length, respectively, of the NMOS NM6. NW3/NL3 is the dimension of the NMOS NM3 of FIG. 6.

Figure 8:
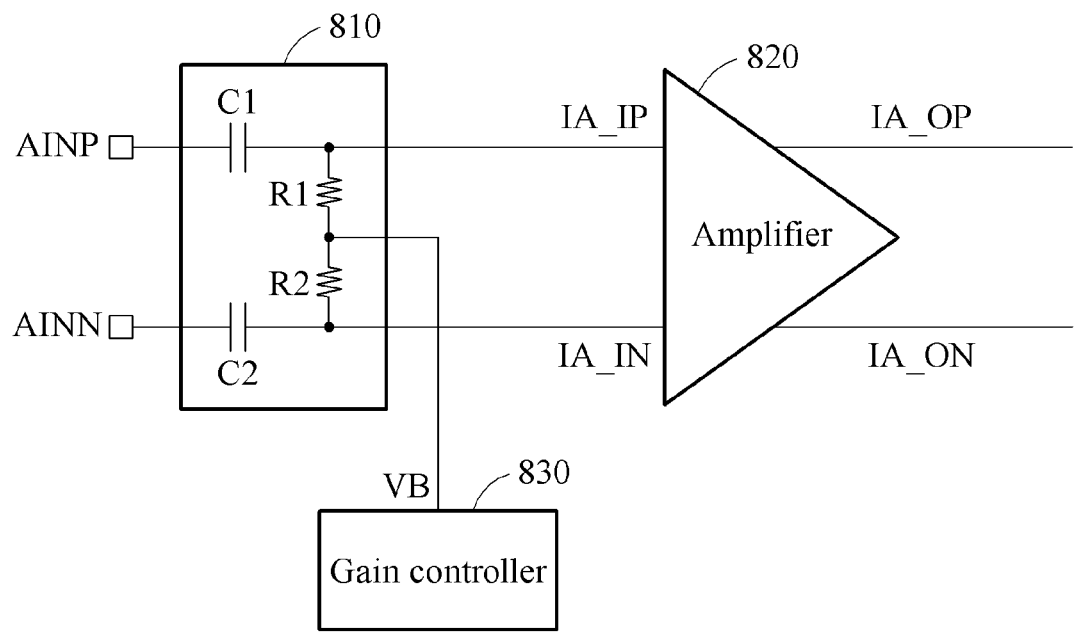
FIG. 8 illustrates an example of a high-pass filter (HPF), an amplifier, and a gain controller.

FIG. 8 illustrates an example of an HPF 810, an amplifier 820, and a gain controller 830.

Referring to FIG. 8, the amplifier 820 amplifies input signals IA_IP and IA_IN and outputs output signals IA_OP and IA_ON. The gain controller 830 controls a gain of the amplifier 820 by adjusting DC levels of the input signals IA_IP and IA_IN of the amplifier 820 through a bias voltage VB. For example, the gain controller 830 includes a voltage digital-to-analog converter (VDAC) which is connected to resistors R1 and R2 in an HPF 810 to adjust an output voltage of the HPF 810 through the bias voltage.

In an example of controlling an amplification gain through a resistance ratio, a combination of a pseudo resistor and a switch is used to implement a high resistance with a small area. In this example, a gain control may be difficult to implement in practice due to a change in performance according to a process corner and a leakage of the pseudo resistor and the switch. In an example, the amplification gain may be controlled by adjusting the DC levels of the input signals IA_IP and IA_IN of the amplifier 820, without using elements such as the pseudo resistor and the switch.

Figure 9:
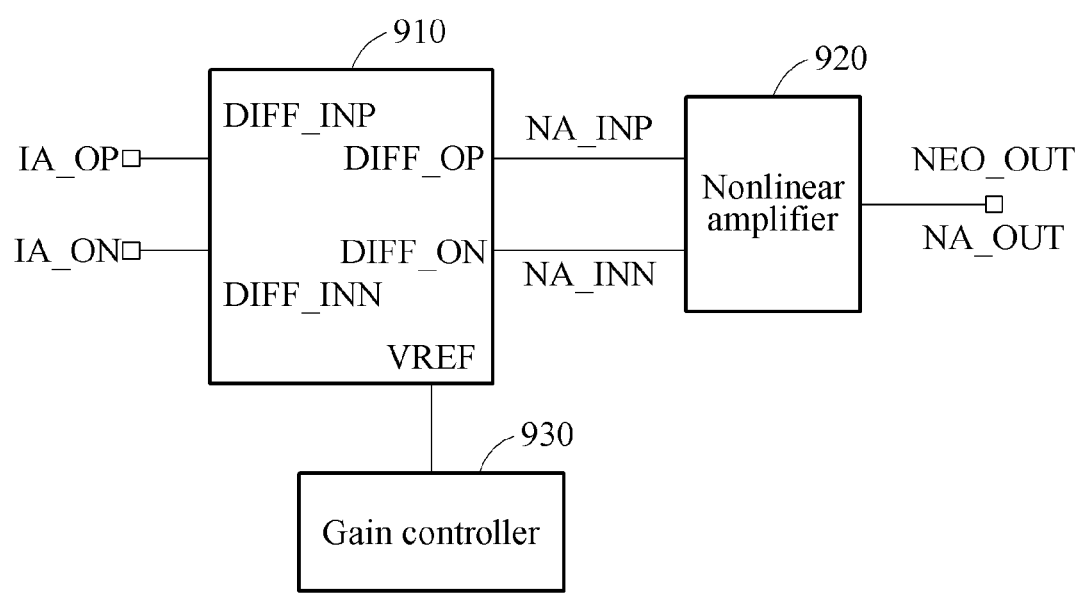
FIG. 9 illustrates an example of a differentiator, a nonlinear amplifier, and a gain controller.

FIG. 9 illustrates an example of a differentiator 910, a nonlinear amplifier 920, and a gain controller 930.

Referring to FIG. 9, the nonlinear amplifier 920 amplifies input signals NA_INP and NA_INN and outputs an output signal NA_OUT. The gain controller 930 controls a gain of the nonlinear amplifier 920 by adjusting DC levels of the input signals NA_INP and NA_INN of the nonlinear amplifier 920 through a reference voltage VREF of the differentiator 910. For example, the gain controller 830 includes a VDAC configured to adjust an output voltage of the differentiator 910 through the reference voltage VREF of the differentiator 910.

Figure 10:
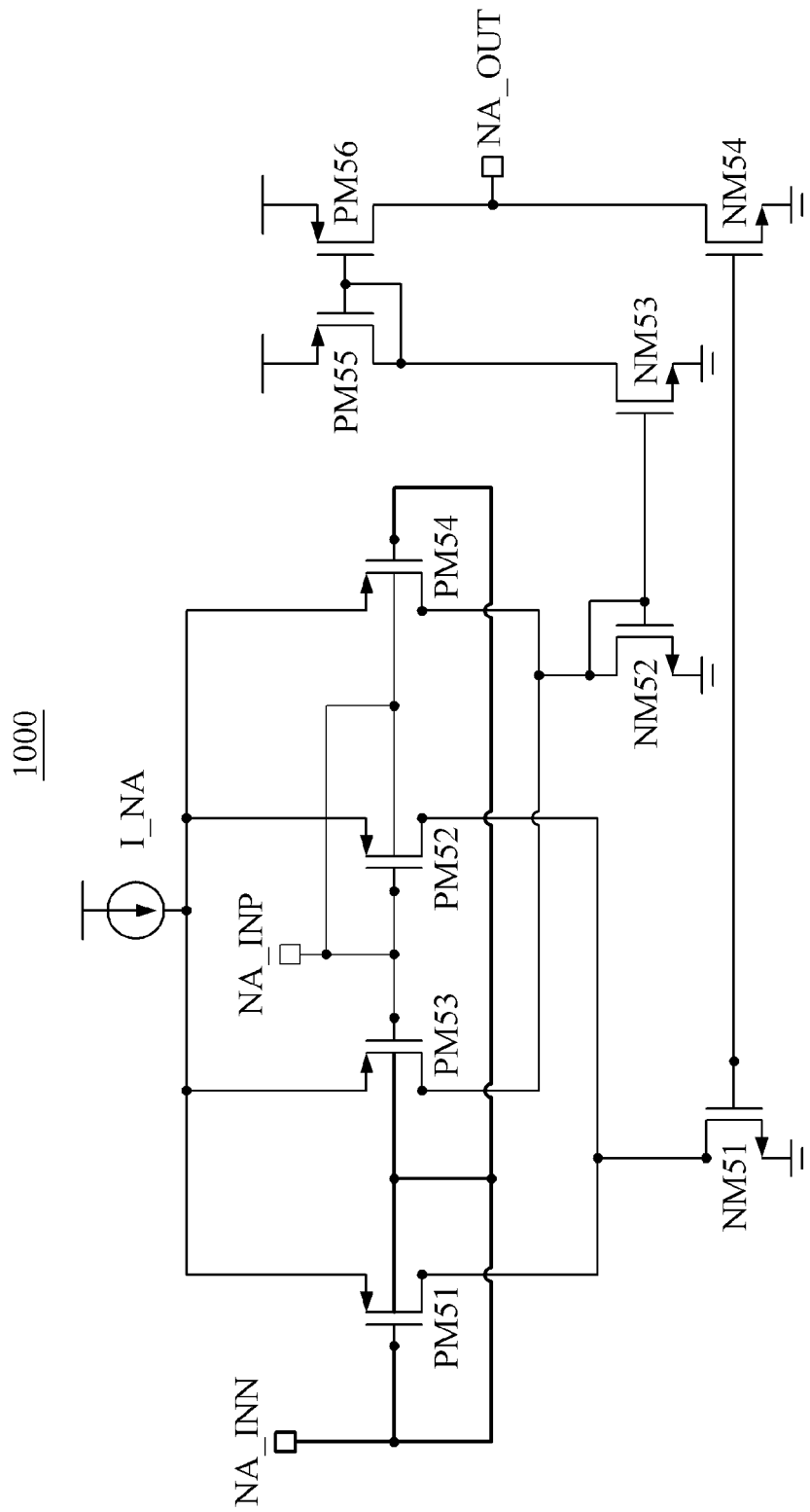
FIG. 10 illustrates an example of a nonlinear amplifier.

FIG. 10 illustrates an example of a nonlinear amplifier 1000.

Referring to FIG. 10, the nonlinear amplifier 1000 includes PMOSs PM51 through PM56 and NMOSs NM51 through NM54. The nonlinear amplifier 1000 amplifies input signals NA_INN and NA_INP and outputs an output signal NA_OUT.

Figure 11:
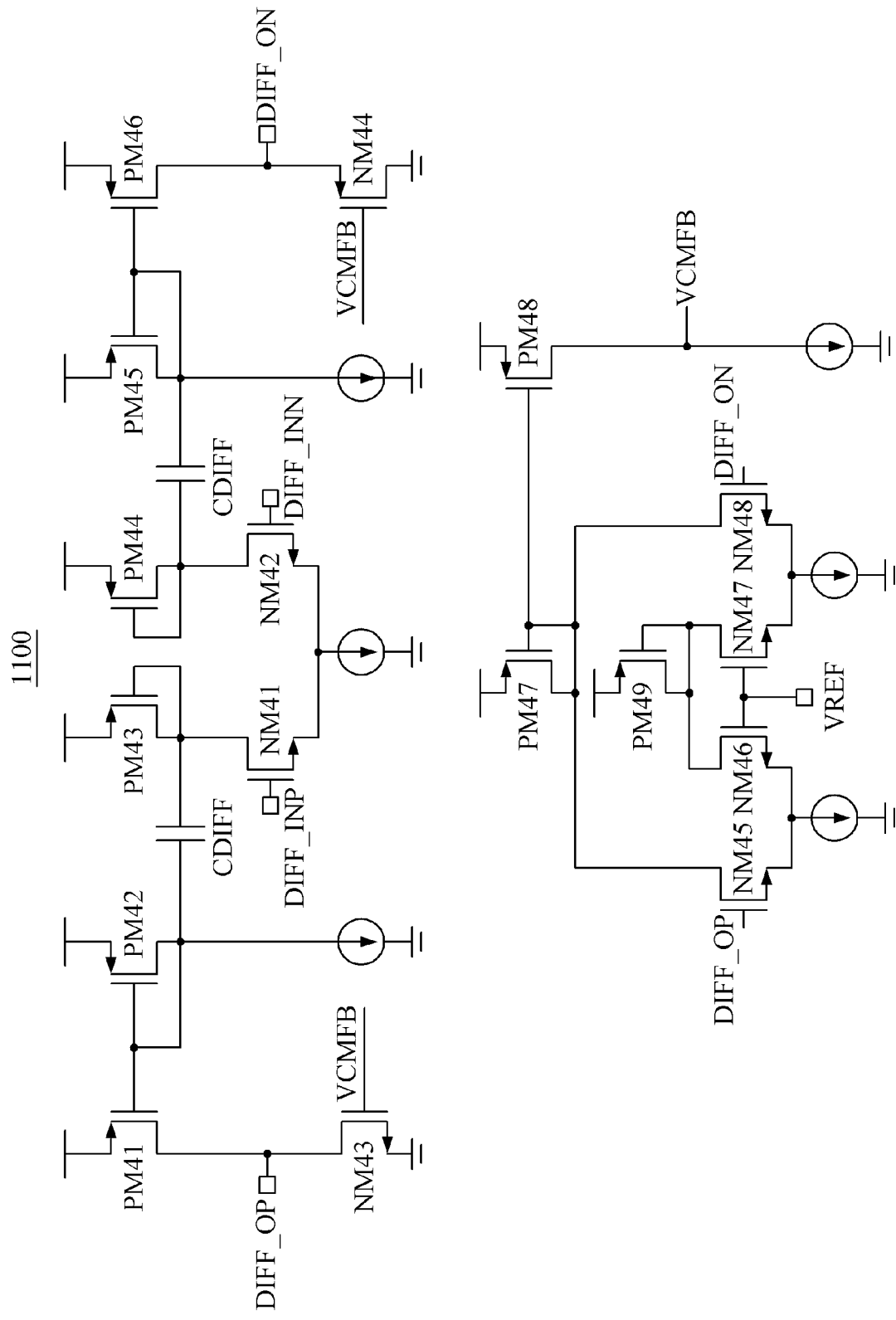
FIG. 11 illustrates an example of a differentiator.

FIG. 11 illustrates an example of a differentiator 1100.

Referring to FIG. 11, the differentiator 1100 includes PMOSs PM41 through PM49, NMOSs NM41 through NM48, and capacitors CDIFF. The differentiator 1100 differentiates input signals DIFF_INP and DIFF_INN and outputs output signals DIFF_OP and DIFF_ON. A DC level of an output voltage of the differentiator 910 is adjusted through a reference voltage VREF applied to gates of the NMOSs NM46 and NM47.

Figure 12:
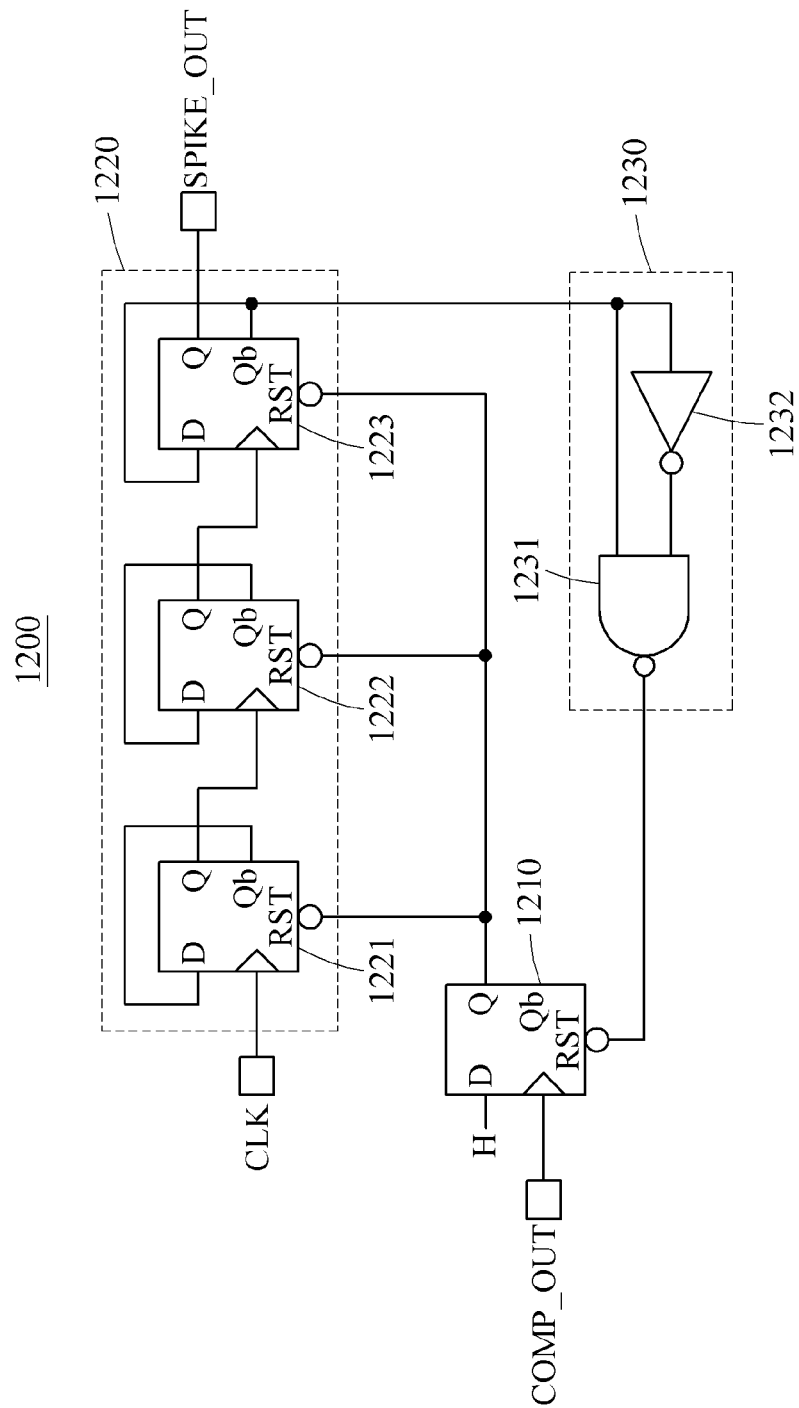
FIG. 12 illustrates an example of a merging circuit.

FIG. 12 illustrates an example of a merging circuit 1200.

Referring to FIG. 12, the merging circuit 1200 includes a flip-flop 1210, a flip-flop circuit 1220, and a reset circuit 1230. The merging circuit 1200 merges spikes within a reference interval of an input signal COMP_OUT into one peak.

The flip-flop 1210 receives the input signal COMP_OUT through a clock port and receives a logical high signal H through an input port D. The input signal COMP_OUT corresponds to the output signal COMP_OUT of the comparator 122 of FIG. 1 or a neural signal.

The flip-flop circuit 1220 includes flip-flops 1221, 1222, and 1223. The flip-flops 1221, 1222, and 1223 each receive an output signal of the flip-flop 1210 and are released from a reset state in response to a first rising edge of the input signal COMP_OUT. If a rising edge appears in a clock signal CLK after the flip-flops 1221, 1222, and 1223 are released from the reset state, a rising edge occurs in an output signal SPIKE_OUT.

In FIG. 12, a number of flip-flops included in the flip-flop circuit 1220 is merely an example, and the flip-flop circuit 1220 may include various numbers of flip-flops. Further, although not shown in FIG. 12, the flip-flop circuit 1220 may include a switch configured to connect or disconnect the flip-flops. Thus, a number of flip-flops to participate in division is determined by controlling the switch.

After the rising edge occurs in the output signal SPIKE_OUT, a falling edge occurs in the output signal SPIKE_OUT in response to an elapse of the reference interval. The reference interval is determined based on the number of flip-flops to participate in division and the clock signal CLK. In an example in which a frequency of the clock signal is the same, the reference interval increases as the number of flip-flops to participate in division increases. Further, in an example in which the number of flip-flops to participate in division is the same, the reference interval increases as the frequency of the clock signal decreases. In the example of FIG. 12, the reference interval corresponds to four clocks of the clock signal CLK, and the falling edge occurs in the output signal SPIKE_OUT in response to an elapse of four clocks of the clock signal CLK after the rising edge occurs in the output signal SPIKE_OUT.

The reset circuit 1230 includes an AND gate 1231 and an inverter 1232. The inverter 1232 serves to delay an input of the inverter 1232. The reset circuit 1230 resets the flip-flop 1210 in response to the falling edge occurring in the output signal SPIKE_OUT.

Figure 13:
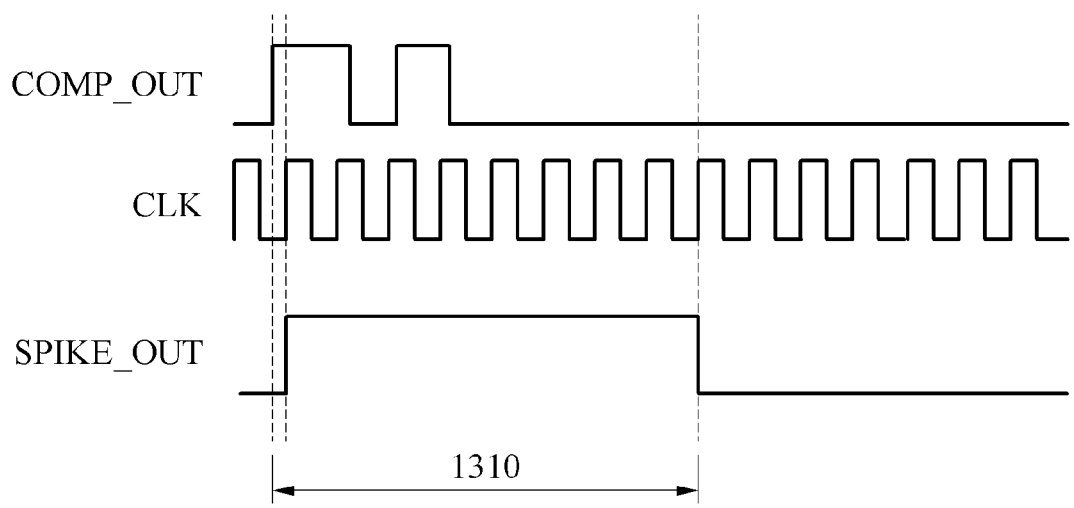
FIG. 13 illustrates an example of a relationship among signals of the merging circuit of FIG. 12.

FIG. 13 illustrates an example of a relationship among signals of the merging circuit of FIG. 12. Referring to FIG. 13, in response to a rising edge of a clock signal CLK appearing after a rising edge of an input signal COMP_OUT of a merging circuit is detected, a rising edge occurs in an output signal SPIKE_OUT of the merging circuit. After a reference interval 1310 elapses, more particularly, if a rising edge of the clock signal CLK is detected after the reference interval 1310 elapses, a falling edge occurs in the output signal SPIKE_OUT. In the example of FIG. 13, the input signal COMP_OUT includes two pulses, whereas the output signal SPIKE_OUT includes a single pulse. Thus, the pulses of the input signal COMP_OUT included in the reference interval 1310 are merged into the single pulse of the output signal SPIKE_OUT.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for detecting a neural spike, the apparatus comprising:
   a preprocessing circuit configured to remove a low-frequency component from a neural signal to form a low-frequency component removed neural signal, and amplify the low-frequency component removed neural signal;
   a comparing circuit configured to compare an output signal of the preprocessing circuit to a threshold signal;

a merging circuit configured to merge spikes within a reference interval of an output signal of the comparing circuit into one peak, and to generate, based on the merging of the spikes, an output signal comprising pulses; and a counting circuit configured to count the pulses.

2. The apparatus of claim 1, wherein the preprocessing circuit comprises
a high-pass filter (HPF) configured to remove the low-frequency component from the neural signal, and
a first amplifier configured to linearly amplify an output signal of the HPF.

3. The apparatus of claim 2, further comprising:
a first gain controller configured to control a gain of the first amplifier by adjusting a direct current (DC) level of an input signal of the first amplifier.

4. The apparatus of claim 3, wherein the first gain controller comprises a voltage digital-to-analog converter (VDAC) configured to adjust an output voltage of the HPF.

5. The apparatus of claim 2, wherein the preprocessing circuit further comprises a common bias generator configured to compensate for a metal oxide semiconductor (MOS) threshold voltage of the first amplifier that varies.

6. The apparatus of claim 5, wherein the common bias generator comprises
an average generator configured to generate an average of differential output signals of the first amplifier,
an offset generator configured to generate an offset value corresponding to the average generator,
a compensation value generator configured to generate a compensation value to compensate for the MOS threshold voltage of the first amplifier, and
a calculator configured to generate a feedback signal by performing a calculation on an output signal of the average generator, the offset value, and the compensation value,
wherein the feedback signal is supplied to the first amplifier to compensate for the MOS threshold voltage of the first amplifier.

7. The apparatus of claim 2, wherein the preprocessing circuit comprises
a differentiator configured to differentiate an output signal of the first amplifier, and
a second amplifier configured to linearly amplify an output signal of the differentiator.

8. The apparatus of claim 7, further comprising:
a second gain controller configured to control a gain of the second amplifier by adjusting a DC level of an input signal of the second amplifier.

9. The apparatus of claim 8, wherein the second gain controller comprises a VDAC configured to adjust an output voltage of the differentiator.

10. The apparatus of claim 1, wherein the comparing circuit comprises a threshold signal generator configured to generate, as the threshold signal, either one or both of a dynamic signal based on the output signal of the preprocessing circuit and a static signal having a predetermined level.

11. The apparatus of claim 1, wherein the merging circuit comprises:
a first flip-flop configured to receive the output signal of the comparing circuit through a clock port and receive a logical high signal through an input port;
a flip-flop circuit comprising at least one second flip-flop, the flip-flop circuit being configured to receive an output signal of the first flip-flop through a reset port of each of the at least one second flip-flop, generate a rising edge in the output signal comprising the pulses based on a clock signal after being released from a reset state in response to a first rising edge of the output signal of the comparing circuit, and generate a falling edge in the output signal comprising the pulses after the reference interval elapses, based on the clock signal; and
a reset circuit configured to reset the first flip-flop after the reference interval elapses.

12. The apparatus of claim 11, wherein the flip-flop circuit is further configured to generate the falling edge in the output signal comprising the pulses after the reference interval elapses based on the clock signal, and
the reset circuit is further configured to reset the first flip-flop in response to the falling edge.

13. An amplification apparatus, comprising:
a differentiator configured to remove a low-frequency component from an input signal of the differentiator;
an amplifier configured to amplify an input signal of the amplifier; and
a gain controller configured to control a gain of the amplifier by adjusting a direct current (DC) level of the input signal of the amplifier,
wherein the input signal of the amplifier corresponds to an output signal of the differentiator.

14. The amplification apparatus of claim 13, wherein the gain controller comprises a voltage digital-to-analog converter (VDAC) configured to adjust an output voltage of the differentiator.

15. An amplification apparatus, comprising:
an amplifier configured to amplify an input signal of the amplifier; and
a common bias generator configured to compensate for a metal oxide semiconductor (MOS) threshold voltage of the amplifier that varies, by providing a feedback signal to the amplifier generated based on an average of differential output signals of the amplifier;
wherein the common bias generator comprises:
an average generator configured to generate the average of the differential output signals of the amplifier; and
an offset generator configured to generate an offset value corresponding to the average generator.

16. The amplification apparatus of claim 15, wherein the common bias generator comprises
a compensation value generator configured to generate a compensation value to compensate for the MOS threshold voltage of the amplifier, and
a calculator configured to generate the feedback signal by performing a calculation on an output signal of the average generator, the offset value, and the compensation value,
wherein the feedback signal is supplied to the amplifier to compensate for the MOS threshold voltage of the amplifier.

17. The amplification apparatus of claim 16, wherein the performing of the calculation on the output signal of the average generator, the offset value, and the compensation value comprises subtracting the offset value from the output signal of the average generator and adding the compensation value to a result of the subtracting of the offset value from the output signal of the average generator.

18. An apparatus for detecting a neural spike, the apparatus comprising:
a merging circuit configured to merge spikes within a reference interval of an input signal corresponding to a neural signal into one pulse of an output signal by generating a rising edge in the output signal based on a clock signal and in response to a first rising edge of the input signal, and generating a falling edge in the output signal based on a clock signal and in response to the reference interval elapsing; and a counting circuit configured to count pulses of the output signal, wherein the merging circuit comprises a first flip-flop configured to receive an input signal corresponding to the neural signal through a clock port and receive a logical high signal through an input port.

19. The apparatus of claim 18, wherein the merging circuit comprises a flip-flop circuit comprising at least one second flip-flop, the flip-flop circuit being configured to receive an output signal of the first flip-flop through a reset port of each of the at least one second flip-flop, generate the rising edge in the output signal comprising the pulses based on the clock signal after being released from a reset state in response to the first rising edge of the input signal corresponding to the neural signal, and generate the falling edge in the output signal comprising the pulses after the reference interval elapses based on the clock signal, and a reset circuit configured to reset the first flip-flop after the reference interval elapses.

20. The apparatus of claim 19, wherein the flip-flop circuit is further configured to generate the falling edge in the output signal comprising the pulses after the reference interval elapses, based on the clock signal, and wherein the reset circuit is further configured to reset the first flip-flop in response to the falling edge.

21. The apparatus of claim 18, wherein the counting of the pulses indicates a frequency of the spikes.

22. The apparatus of claim 18, wherein the counting of the pulses is based on a period of a period of a reference signal generated by the counting circuit.

* * * * *